United States Patent
Bergmann et al.

(10) Patent No.: US 11,303,296 B2
(45) Date of Patent: Apr. 12, 2022

(54) HARDWARE ACCELERATED COMPRESSION OF INSTRUMENTATION DATA

(71) Applicant: INTERNATIONAL BUSINESS MACHINES CORPORATION, Armonk, NY (US)

(72) Inventors: Tobias U. Bergmann, Weinstadt (DE); Klaus Theurich, Gechingen (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 288 days.

(21) Appl. No.: 16/018,353

(22) Filed: Jun. 26, 2018

(65) Prior Publication Data

US 2019/0393888 A1 Dec. 26, 2019

(51) Int. Cl.
*G06F 16/00* (2019.01)
*H03M 7/30* (2006.01)
*G06F 3/06* (2006.01)
*G06F 12/0811* (2016.01)

(52) U.S. Cl.
CPC ............ *H03M 7/30* (2013.01); *G06F 3/0608* (2013.01); *G06F 3/0656* (2013.01); *G06F 3/0673* (2013.01); *G06F 12/0811* (2013.01); *G06F 2212/1044* (2013.01)

(58) Field of Classification Search
CPC ..................................................... G06F 16/00
See application file for complete search history.

(56) References Cited

U.S. PATENT DOCUMENTS

| 4,590,550 A * | 5/1986 | Eilert | G06F 11/3495 702/179 |
| 7,870,438 B2 | 1/2011 | Bartik et al. | |
| 8,566,286 B1 * | 10/2013 | Hawton | G06F 11/1458 707/654 |
| 2009/0013126 A1 * | 1/2009 | Hallivuori | H04L 41/0856 711/103 |
| 2009/0210196 A1 * | 8/2009 | Bartik | G06F 11/3466 702/186 |

(Continued)

FOREIGN PATENT DOCUMENTS

| CN | 106021417 A | 10/2016 |
| CN | 106649735 A | 5/2017 |
| JP | 10275101 A | 10/1998 |

OTHER PUBLICATIONS

A. Reinhardt et al., "Stream-oriented Lossless Packet Compression in Wireless Sensor Networks", IEE Communications Society, IEEE Secon 2009 Proceedings, pp. 1-9.

(Continued)

*Primary Examiner* — Khanh B Pham
(74) *Attorney, Agent, or Firm* — Cantor Colburn LLP; Edward Wixted

(57) ABSTRACT

Embodiments include method, systems and computer program products for compressing instrumentation data. Aspects include defining an intermediate region of memory. Instrumentation data associated with a processing device is received and stored in the intermediate region of the memory. The instrumentation data is compressed in the intermediate region of memory and stored in a sample region of memory.

20 Claims, 4 Drawing Sheets

(56) References Cited

U.S. PATENT DOCUMENTS

| | | | |
|---|---|---|---|
| 2012/0136586 A1* | 5/2012 | Spreadbury | H04L 49/9031 |
| | | | 702/23 |
| 2015/0339059 A1* | 11/2015 | Kang | G06F 12/023 |
| | | | 711/154 |
| 2016/0098439 A1 | 4/2016 | Dickie et al. | |
| 2019/0081637 A1* | 3/2019 | Pool | H03M 7/3079 |

OTHER PUBLICATIONS

F. Marcelloni et al., "A Simple Alogirthm for Data Compression in Wireless Sensor Networks", IEEE Communications Letters, vol. 12, No. 6, Jun. 2008, pp. 411-413.

IBM Corporation, [online]; [retrieved on Feb. 1, 2018]; retrieved from the Internet https://www.ibm.com/support/knowledgecenter/SSFKSJ_7.0.1/com.ibm.mq.csqsat.doc/zc10755_.htm, "Log Compression", IBM Knowledge Center, Jan. 30, 2018, 3p.

* cited by examiner

HARDWARE ACCELERATED COMPRESSION OF INSTRUMENTATION DATA

BACKGROUND

The present invention generally relates to hardware acceleration, and more specifically, to hardware accelerated compression of instrumentation data.

In computer technology, performance monitoring of microprocessors can be performed by hardware counters which are a set of special-purpose registers that store counts of hardware-related activities within the computer system. Each of these hardware counters can be programmed with an index of an event type to be monitored, like an L1 cache miss or a branch misprediction. Given the speed of modern day microprocessors, large amounts of data can be collected by the hardware counters in a relatively short amount of time.

SUMMARY

Embodiments of the present invention are directed to a computer-implemented method for compressing instrumentation data. A non-limiting example of the computer-implemented method includes defining an intermediate region of memory. Instrumentation data associated with a processing device is received and stored in the intermediate region of the memory. The instrumentation data is compressed in the intermediate region of memory and stored in a sample region of memory.

Embodiments of the present invention are directed to a system for compressing instrumentation data. A non-limiting example of the system includes a processor communicatively coupled to a memory, the processor operable to define an intermediate region of memory. Instrumentation data associated with a processing device is received and stored in the intermediate region of the memory. The instrumentation data is compressed in the intermediate region of memory and stored in a sample region of memory.

Embodiments of the invention are directed to a computer program product for compressing instrumentation data, the computer program product comprising a computer readable storage medium having program instructions embodied therewith. The program instructions are executable by a processor to cause the processor to perform a method. A non-limiting example of the method includes defining an intermediate region of memory. Instrumentation data associated with a processing device is received and stored in the intermediate region of the memory. The instrumentation data is compressed in the intermediate region of memory and stored in a sample region of memory.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
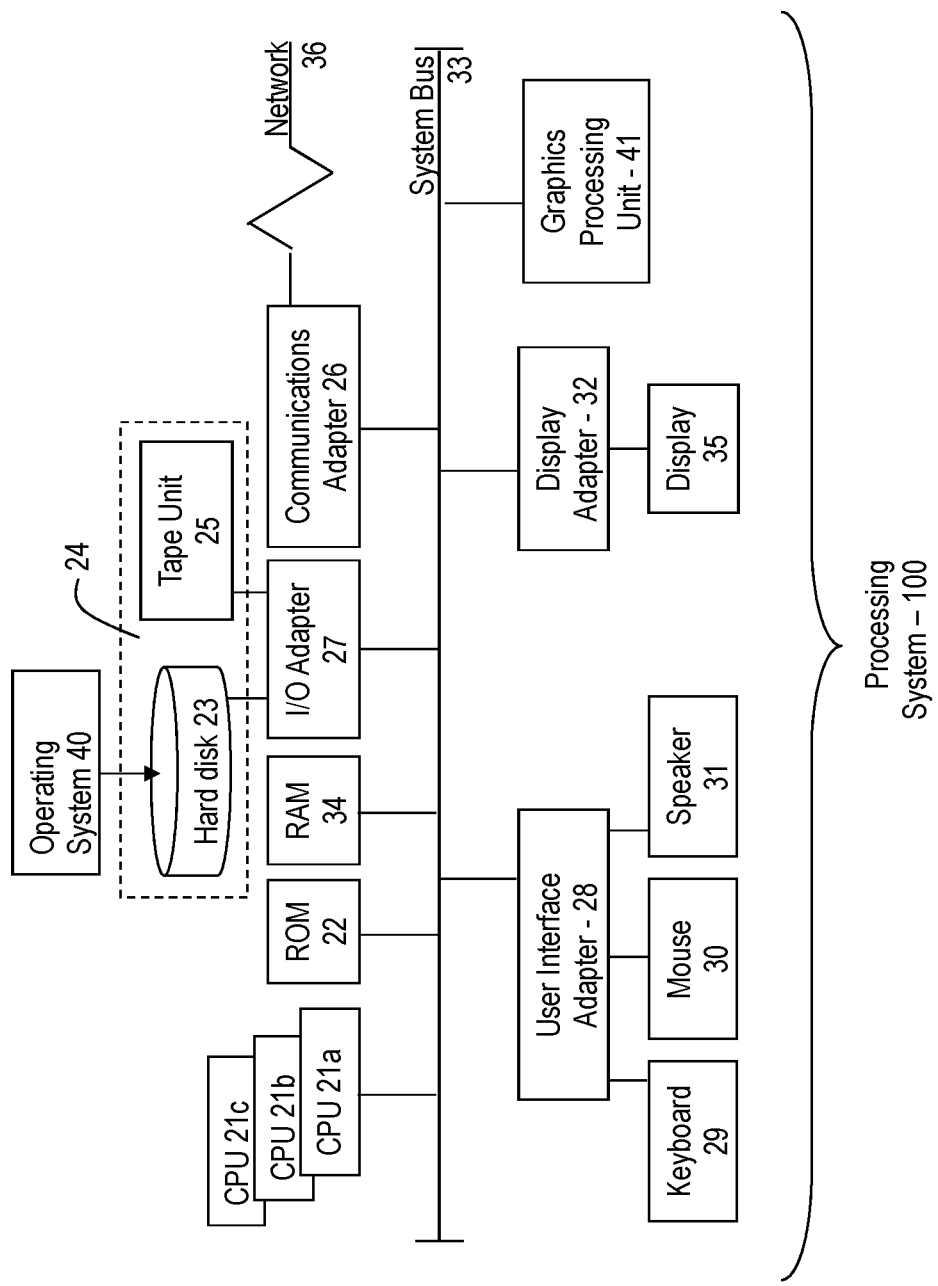
FIG. 1 depicts a block diagram of a computer system for use in implementing one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Referring to FIG. 1, there is shown an embodiment of a processing system 100 for implementing the teachings herein. In this embodiment, the system 100 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 and various other components via a system bus 33. Read only memory (ROM) 22 is coupled to the system bus 33 and may include a basic input/output system (BIOS), which controls certain basic functions of system 100.

FIG. 1 further depicts an input/output (I/O) adapter 27 and a network adapter 26 coupled to the system bus 33. I/O adapter 27 may be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 100 may be stored in mass storage 24. A network adapter 26 interconnects bus 33 with an outside network 36 enabling data processing system 300 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 100 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 1, the system 100 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 1.

Turning now to an overview of technologies that are more specifically relevant to aspects of the invention, hardware instrumentation data is typically written into a sample buffer which is split into segments so that each processing unit (PU) can fill its own unique memory block. Currently, the recording of this hardware instrumentation data is restricted to either a short timeframe of about 100 seconds with a high sample frequency. Or the recording occurs over longer timeframes with reduced sample frequency. For benchmark runs that take several hours, diagnostic resolution can be lost. Also, setting up several recording sessions for the same benchmark run is often not acceptable because writing the sampled data to disk interferes with the workload under test.

Turning now to an overview of the aspects of the invention, one or more embodiments of the invention address the above-described shortcomings of the prior art by providing a system for compressing instrumentation data being sampled utilizing hardware accelerated compression in an intermediate buffer before writing the sampled instrumentation data to disk or secondary storage.

The above-described aspects of the invention address the shortcomings of the prior art by allowing for longer term hardware instrumentation data sampling with higher sampling frequencies. Though large amounts of instrumentation data will be collected with the higher frequency and longer term, the hardware accelerated compression at the PU core allows a lossless compression of a factor of roughly 5 or 6 which translates to a 5 to 6 times longer recording session at the same sampling frequency.

Figure 2:
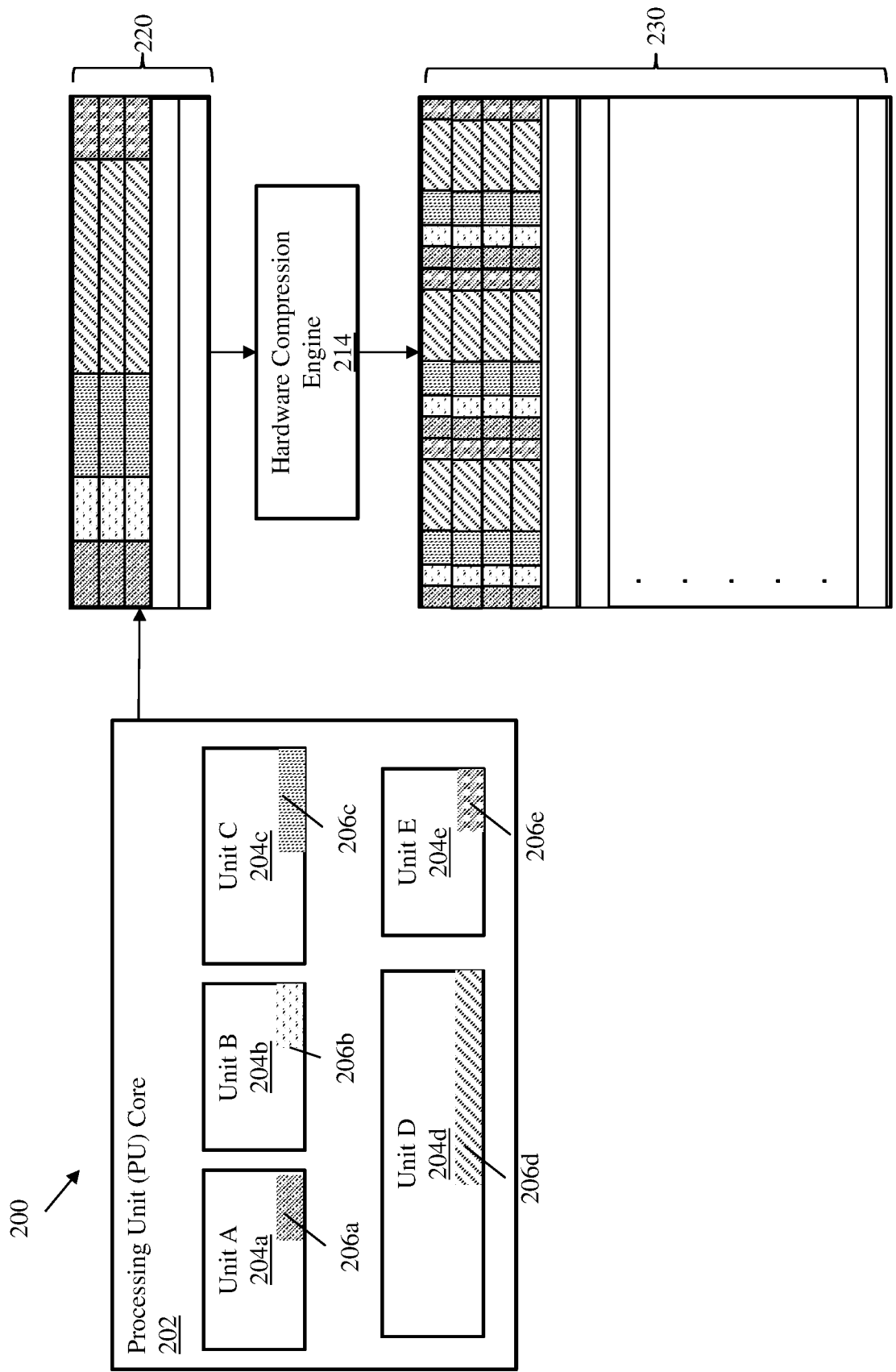
FIG. 2 depicts a block diagram of a system for compressing instrumentation data according to one or more embodiments of the present invention.

Turning now to a more detailed description of aspects of the present invention, FIG. 2 depicts a block diagram of a system hardware acceleration of instrumentation data according to embodiments of the invention. The system 200 includes a processing unit (PU) core 202 with five work units (Unit A 204a, Unit B 204b, Unit C 204c, Unit D 204d, and Unit E 204e). The PU core 202 can be any type of processing unit and can be one of many PU Cores in the computing system. The five work units described herein are illustrative and not meant to limit the scope or number of work units that can be utilized in this system 200. The work units can be any type of hardware on the PU core 202 such as, for example, a floating point unit, instruction set unit, and the like. During PU core 202 sampling, instrumentation data is collected on the five work units in the PU core 202. The instrumentation data is stored in registers 206a, 206b, 206c, 206d, 206e associated with each of the work units 204a, 204b, 204c, 204d, 204e. Each work unit can have different sized registers for the collection of instrumentation data for each work unit. The size registers can be based on the function of the work unit and the specific data being obtained from the PU Core 202. Once extracted from the registers 206a, 206b, 206c, 206d, 206e the instrumentation data is stored in an intermediate buffer 220. The intermediate buffer 220, which will be described in greater detail in FIG. 3, can be any type or number of buffers such as, for example, a ring buffer or a double buffer set up. The intermediate buffer 220 is a memory location in the L1 or L2 cache or the lowest cache level not shared with other PU Cores in a computing system. The intermediate buffer 220 stores the instrumentation data before sending the instrumentation data to the hardware compression engine 214 for compressing the instrumentation data and sending to the sample buffer 230. In one or more embodiments, the sample buffer 230 is a lower level of memory in a memory hierarchy such as, for example, hard disk or secondary memory.

In one or more embodiments, the hardware compression engine 214 is a hardware compression accelerator that can be local to the PU Core 202 or shared across multiple PU Cores. Hardware accelerators (or hardware acceleration) is the use of computer hardware to perform some functions more efficiently than through software running on a more general purpose CPU. The hardware accelerators can be suitable for repetitive, intensive tasks such as data compression. Specialized processors can be utilized for hardware acceleration such as, for example, GPUs, FPGAs, and ASICs.

In one or more embodiments, the registers 206a, 206b, 206c, 206d, 206e can be latched with a hardware sample pulse for each of the work units 204a, 204b, 204c, 204d, 204e. This hardware sample pulse can trigger a PU Core 202 interrupt. A PU interrupt handler can gather the hardware instrumentation data from each work unit 204a, 204b, 204c, 204d, 204e and store each record in the intermediate buffer 220 using an intermediate write pointer. The intermediate write pointer can then be incremented. When the intermediate buffer is full or exceeds a threshold memory level, the hardware compression engine 214 compresses the instrumentation data and writes the compressed instrumentation data to the sample buffer 230. The PU interrupt hander will return control to the PU Core 202 for normal software operation. This can be repeated until the sample buffer 230 is full and/or when the sampling is completed.

Figure 3B:
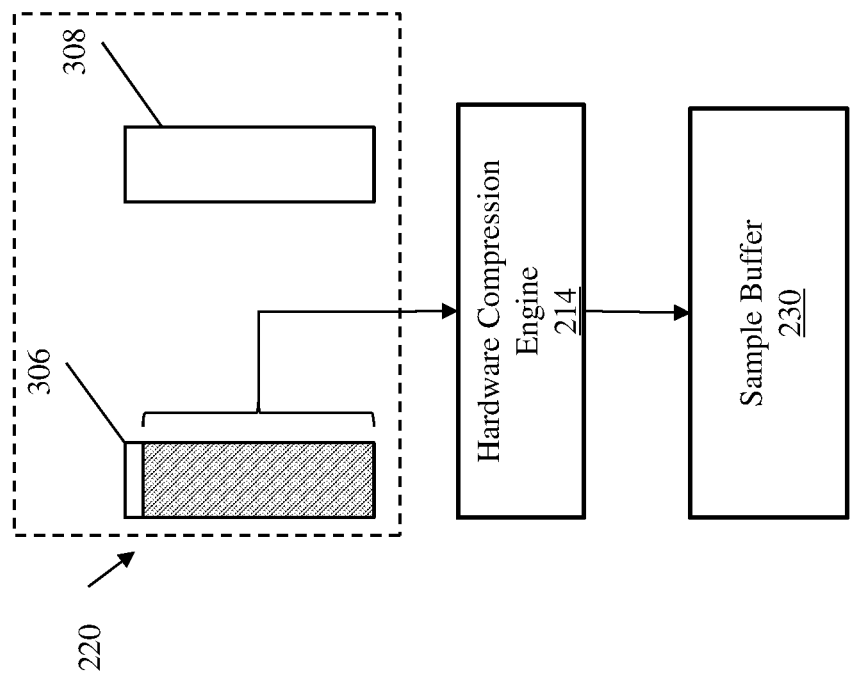
FIG. 3B depicts a block diagram of the intermediate buffer as two buffers according to one or more embodiments of the invention.
Figure 3A:
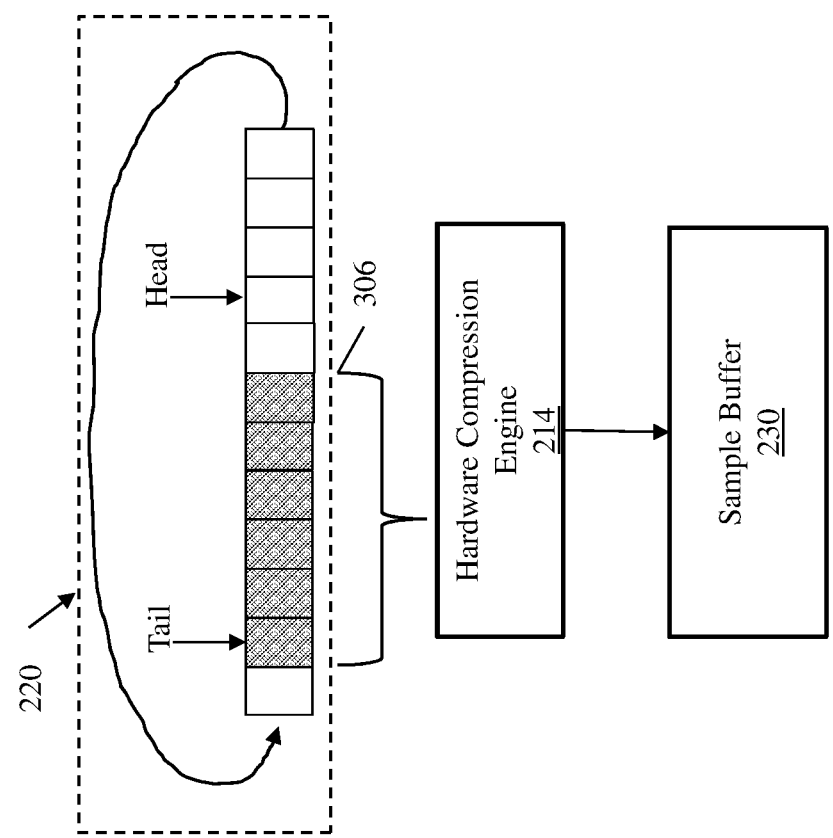
FIG. 3A depicts a block diagram of the intermediate buffer as a ring buffer according to one or more embodiments of the invention.

FIG. 3a depicts the intermediate buffer as a ring buffer according to one or more embodiments of the invention. The ring buffer can have a predefined threshold size which includes how many ring buffer entries must be compressed in one chunk to get the highest efficiency from the hardware compression engine 214. When the hardware instrumentation data exceeds the threshold size in the ring buffer, a chunk is formed and sent to the hardware compression engine 214 to perform data compression. The compressed instrumentation data can then be sent to the sample buffer 230. When using a ring buffer, sample data is continuously added to the end of the buffer. Once enough unprocessed data is in the buffer (exceeding a predefined threshold) a new block is sent to the compression engine. The start pointer of the ring buffer is set to the same position as the current end pointer. The difference between end pointer and start pointer (computed in MODULO arithmetic) gives the length of the so far unprocessed data.

FIG. 3b depicts the intermediate buffer as two buffers according to one or more embodiments of the invention. The intermediate buffer 220 can include two buffers 306, 308 which are used to store the uncompressed hardware instrumentation data. The intermediate buffer 220 would activate the first buffer 306. If the first buffer 306 is full or exceeds a memory threshold, the instrumentation data in the first buffer 306 is sent to the hardware compression engine 214. The second buffer 308 would activate and the hardware instrumentation data would be stored in the second buffer 308 during data compression from the first buffer 306. Then, as the second buffer 308 becomes full or exceeds a memory threshold, the hardware instrumentation data in the second buffer 308 would be sent to the hardware compression engine 214. The first buffer 306 would then activate and the hardware instrumentation data from the PU Core 202 would be sent to the first buffer 306. This back and forth between buffers can be referred to as a double buffer set up managed by a double buffer algorithm. In one or more embodiments, a fixed amount of uncompressed data can be defined and when this fixed amount of uncompressed data is collected, a "stop event" can occur. This stop event stops the instrumentation data collection. The stop even can be implemented as a firmware call in code. In one or more embodiments, this stop event can be determined by counting the number of switch events (e.g., switching between the first buffer and second buffer) in the buffer holding the uncompressed data. In one or more embodiments, the stop event can be triggered by a defined level of compressed data such that the buffer holding the compressed data is full.

Figure 4:
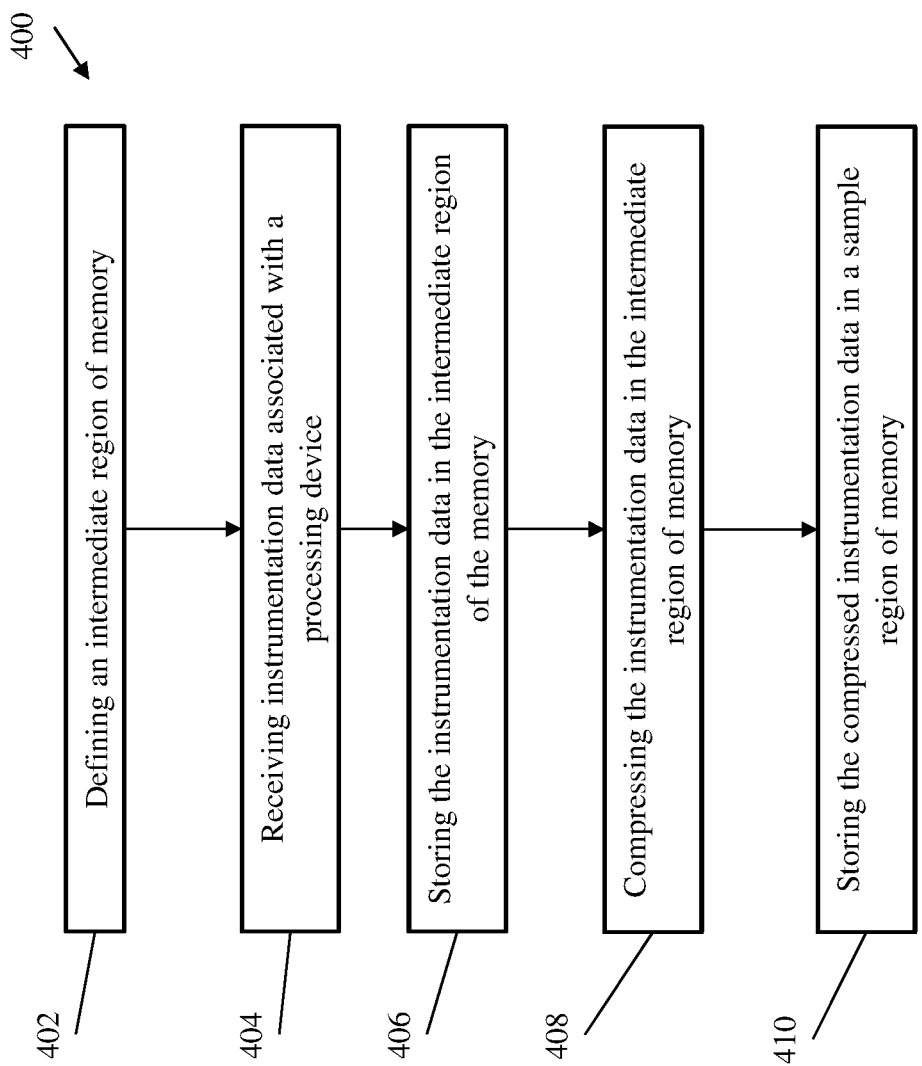
FIG. 4 depicts a flow diagram of a method for compressing data according to one or more embodiments of the invention.

FIG. 4 depicts a flow diagram of a method for compressing instrumentation data according to one or more embodiments of the invention. The method 400 includes defining an intermediate region of memory, as shown in block 402. The intermediate region of memory can include the first buffer 306 and second buffer 308. In one or more embodiments, the intermediate region can be any memory region defined in the cache. Buffer types can include a ring buffer, for example. At block 404, the method 400 includes receiving instrumentation data associated with a processing device. The instrumentation data can be hardware performance data for the processing device. Then, at block 406, the method 400 includes storing the instrumentation data in the intermediate region of the memory. The method 400, at block 408, includes compressing the instrumentation data in the intermediate region of memory. In one or more embodiments, the compression is accelerated utilizing a hardware accelerator. And at block 410, the method 400 includes storing the compressed instrumentation data in a sample region of memory. The sample region can be the sample buffer 230 described in FIG. 2.

Additional processes may also be included. It should be understood that the processes depicted in FIG. 4 represent illustrations and that other processes may be added or existing processes may be removed, modified, or rearranged without departing from the scope and spirit of the present invention.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for compression of instrumentation data, the method comprising:
    defining an intermediate region of memory for a processing core, the intermediate region being specific to the processing core, wherein the intermediate region comprises a region in a L1 cache or L2 cache for the processing core;
    obtaining instrumentation data associated with one or more work units of the processing core, wherein the instrumentation data is stored in a plurality of hardware registers, wherein each hardware register in the plurality of hardware registers is associated with a work unit of the one or more work units, wherein the one or more work units comprise an instruction set unit, wherein the hardware register is latched with a hardware sample pulse for each work unit in the one or more work units, wherein the plurality of hardware registers comprises a first register and a second register, wherein the first register comprises a first size and the second register comprises a second size, wherein the first size is larger than the second size, and wherein the first size is based on a function of a first work unit associated with the first register;

writing, using an intermediate write pointer, the instrumentation data in the intermediate region of the memory;

compressing the instrumentation data in the intermediate region of memory; and storing the compressed instrumentation data in a sample region of memory, wherein the sample region of memory comprises a region in a hard disk memory for the processing core.

2. The computer-implemented method of claim 1, wherein the intermediate region of memory is a higher level memory than the sample region of memory.

3. The computer-implemented method of claim 1, wherein the intermediate region of memory comprises a first buffer and a second buffer.

4. The computer-implemented method of claim 3, wherein storing the instrumentation data in the intermediate region of memory comprises:

storing the instrumentation data in the first buffer; and
responsive to a storage capacity of the first buffer exceeding a threshold, storing the instrumentation data in the second buffer.

5. The computer-implemented method of claim 4, wherein compressing the instrumentation data comprises responsive to the storage capacity of the first buffer exceeding the threshold, compressing the instrumentation data stored in the first buffer.

6. The computer-implemented method of claim 5, wherein compressing the instrumentation data further comprises:

responsive to a storage capacity of the second buffer exceeding a second threshold, compressing the instrumentation data stored in the second buffer.

7. The computer-implemented method of claim 1, wherein the intermediate region of memory comprises a ring buffer.

8. The computer-implemented method of claim 7, wherein compressing the instrumentation data comprises responsive to a storage capacity of the ring buffer exceeding a threshold, compressing the instrumentation data.

9. The computer-implemented method of claim 1, wherein the intermediate region of memory is an L1 or an L2 cache.

10. The computer-implemented method of claim 1, wherein the compressing the instrumentation data is performed by a hardware compressor.

11. A system for compression of instrumentation data, the system comprising:

a processor communicatively coupled to a memory, the processor operable to:

define an intermediate region of memory for a processing core, the intermediate region being specific to the processing core, wherein the intermediate region comprises a region in a L1 cache or L2 cache for the processing core;

obtain instrumentation data associated with one or more work units of the processing core, wherein the instrumentation data is stored in a plurality of hardware registers, wherein each hardware register in the plurality of hardware registers is associated with each work unit of the one or more work units, wherein the one or more work units comprise an instruction set unit, wherein the hardware register is latched with a hardware sample pulse for each work unit in the one or more work units, wherein the plurality of hardware registers comprises a first register and a second register, wherein the first register comprises a first size and the second register comprises a second size, wherein the first size is larger than the second size, and wherein the first size is based on a function of a first work unit associated with the first register;

write, using an intermediate write pointer, the instrumentation data in the intermediate region of the memory;

compress the instrumentation data in the intermediate region of memory; and store the compressed instrumentation data in a sample region of memory, wherein the sample region of memory comprises a region in a hard disk memory for the processing core.

12. The system of claim 11, wherein the intermediate region of memory is a higher level memory than the sample region of memory.

13. The system of claim 11, wherein the intermediate region of memory comprises a first buffer and a second buffer.

14. The system of claim 13, wherein storing the instrumentation data in the intermediate region of memory comprises:

storing the instrumentation data in the first buffer; and
responsive to a storage capacity of the first buffer exceeding a threshold, storing the instrumentation data in the second buffer.

15. The system of claim 14, wherein compressing the instrumentation data comprises responsive to the storage capacity of the first buffer exceeding the threshold, compressing the instrumentation data stored in the first buffer.

16. A computer program product for compression of instrumentation data, the computer program product comprising a computer readable storage medium having program instructions embodied therewith, wherein the computer readable storage medium is not a transitory signal per se, the program instructions executable by a processor to cause the processor to perform a method comprising:

defining an intermediate region of memory for a processing core, the intermediate region being specific to the processing core, wherein the intermediate region comprises a region in a L1 cache or L2 cache for the processing core;

obtaining instrumentation data associated with one or more work units of the processing core, wherein the instrumentation data is stored in a plurality of hardware registers, wherein each hardware register in the plurality of hardware registers is associated with a work unit of the one or more work units, wherein the one or more work units comprise an instruction set unit, wherein the hardware register is latched with a hardware sample pulse for each work unit in the one or more work units, wherein the plurality of hardware registers comprises a first register and a second register, wherein the first register comprises a first size and the second register comprises a second size, wherein the first size is larger than the second size, and wherein the first size is based on a function of a first work unit associated with the first register;

writing, using an intermediate write pointer, the instrumentation data in the intermediate region of the memory;

compressing the instrumentation data in the intermediate region of memory; and storing the compressed instrumentation data in a sample region of memory, wherein the sample region of memory comprises a region in a hard disk memory for the processing core.

17. The computer program product of claim 16, wherein the intermediate region of memory is a higher level memory than the sample region of memory.

18. The computer program product of claim 16, wherein the intermediate region of memory comprises a first buffer and a second buffer.

19. The computer program product of claim 18, wherein storing the instrumentation data in the intermediate region of memory comprises:

storing the instrumentation data in the first buffer; and responsive to a storage capacity of the first buffer exceeding a threshold, storing the instrumentation data in the second buffer.

20. The computer program product of claim 19, wherein compressing the instrumentation data comprises responsive to the storage capacity of the first buffer exceeding the threshold, compressing the instrumentation data stored in the first buffer.

* * * * *